United States Patent
Kadowaki et al.

(10) Patent No.: US 10,625,391 B2
(45) Date of Patent: Apr. 21, 2020

(54) NON-POROUS MOLDED ARTICLE FOR POLISHING LAYER, POLISHING PAD, AND POLISHING METHOD

(71) Applicant: KURARAY CO., LTD., Kurashiki-shi (JP)

(72) Inventors: Kiyofumi Kadowaki, Kurashiki (JP); Shinya Kato, Kurashiki (JP); Chihiro Okamoto, Kurashiki (JP); Mitsuru Kato, Kurashiki (JP); Minori Takegoshi, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 0 days.

(21) Appl. No.: 15/516,607

(22) PCT Filed: Oct. 27, 2015

(86) PCT No.: PCT/JP2015/005371
§ 371 (c)(1),
(2) Date: Apr. 3, 2017

(87) PCT Pub. No.: WO2016/067588
PCT Pub. Date: May 6, 2016

(65) Prior Publication Data
US 2017/0291275 A1    Oct. 12, 2017

(30) Foreign Application Priority Data

Oct. 31, 2014    (JP) .................................. 2014-223078

(51) Int. Cl.
| | | |
|---|---|---|
| *B24D 3/28* | (2006.01) | |
| *B24B 37/24* | (2012.01) | |
| *B24B 37/22* | (2012.01) | |
| *H01L 21/304* | (2006.01) | |
| *C08G 18/08* | (2006.01) | |
| *C08G 18/32* | (2006.01) | |
| *C08G 18/66* | (2006.01) | |

(52) U.S. Cl.
CPC .............. *B24B 37/24* (2013.01); *B24B 37/22* (2013.01); *B24D 3/28* (2013.01); *C08G 18/0895* (2013.01); *C08G 18/3203* (2013.01); *C08G 18/6607* (2013.01); *H01L 21/304* (2013.01); *C08J 2375/04* (2013.01)

(58) Field of Classification Search
CPC ........... B24B 37/24; B24B 37/22; B24D 3/28; C08G 18/0895; C08G 18/3203; C08G 18/6607; H01L 21/304
See application file for complete search history.

(56) References Cited

U.S. PATENT DOCUMENTS

| | | | |
|---|---|---|---|
| 6,706,383 | B1 | 3/2004 | Obeng et al. |
| 7,371,160 | B1* | 5/2008 | Cruz ....................... B24B 37/24 |
| | | | 451/526 |
| 2009/0298392 | A1 | 12/2009 | Okamoto et al. |
| 2010/0120343 | A1 | 5/2010 | Kato et al. |
| 2010/0162631 | A1* | 7/2010 | Sato ....................... B24B 37/205 |
| | | | 51/295 |
| 2012/0083187 | A1 | 4/2012 | Okamoto et al. |
| 2012/0085038 | A1 | 4/2012 | Jeong et al. |

FOREIGN PATENT DOCUMENTS

| | | |
|---|---|---|
| JP | 11-322878 A | 11/1999 |
| JP | 2000-178374 A | 6/2000 |
| JP | 2000-248034 A | 9/2000 |
| JP | 2001-89548 A | 4/2001 |
| JP | 2002-371154 A | 12/2002 |
| JP | 2005-537946 A | 12/2005 |
| JP | 2006-231429 A | 9/2006 |
| JP | 2008-173760 A | 7/2008 |
| JP | 2009-101487 A | 5/2009 |
| JP | 2012-529553 A | 11/2012 |
| JP | 2014-38916 A | 2/2014 |
| TW | 200920548 A | 5/2009 |
| WO | WO 2007/034980 A1 | 3/2007 |

OTHER PUBLICATIONS

International Search Report dated Jan. 19, 2016 in PCT/JP2015/005371 filed Oct. 27, 2015.

* cited by examiner

*Primary Examiner* — Pegah Parvini
(74) *Attorney, Agent, or Firm* — Oblon, McClelland, Maier & Neustadt, L.L.P.

(57) ABSTRACT

Disclosed is a non-porous molded article for a polishing layer, the non-porous molded article including a thermoplastic polyurethane, wherein the thermoplastic polyurethane has a maximum value of a loss tangent (tan δ) in a range of −70 to −50° C. of $4.00 \times 10^{-2}$ or less. Preferably, the thermoplastic polyurethane is obtained by polymerization of a polymer diol having a number average molecular weight of 650 to 1400, an organic diisocyanate, and a chain extender, and a content ratio of nitrogen derived from an isocyanate group of the organic diisocyanate is 5.7 to 6.5 mass %.

13 Claims, 4 Drawing Sheets

NON-POROUS MOLDED ARTICLE FOR POLISHING LAYER, POLISHING PAD, AND POLISHING METHOD

TECHNICAL FIELD

The present invention relates to polishing pads, and particularly relates to a polishing pad for polishing a semiconductor wafer, a semiconductor device, a silicon wafer, a hard disk, a glass substrate, an optical product, various metals, or the like.

BACKGROUND ART

Chemical mechanical polishing (CMP) is known as a polishing method used for mirror finishing a semiconductor wafer, and planarizing the surface of an insulating film and a conductive membrane of a semiconductor device. CMP is a method in which the surface of a material to be polished such as a wafer is polished with a polishing pad by using a polishing slurry (hereinafter also simply referred to as "slurry") containing abrasive grains and a reaction liquid.

Conventionally, a non-woven fabric-type polishing pad has been widely used as the polishing pad for CMP. The non-woven fabric-type polishing pad is a flexible polishing pad including a non-woven fabric impregnated with polyurethane. Due to its flexibility, the non-woven fabric-type polishing pad has an advantage of having good contact with a material to be polished. It also has an advantage of having good slurry retention because the non-woven fabric has voids. On the other hand, the non-woven fabric-type polishing pad has a disadvantage of exhibiting a low performance in planarizing the surface to be polished (hereinafter referred to as "planarization performance") due to its flexibility. The non-woven fabric-type polishing pad also has a disadvantage that scratching is likely to occur on the surface to be polished when the voids of the non-woven fabric are clogged by abrasive grains and polishing debris. Another disadvantage is that abrasive grains and polishing debris cannot be sufficiently removed by washing when they have entered deeply into the voids of the non-woven fabric, resulting in a short life.

A polishing pad composed mainly of a polymer foam having a closed-cell structure is also known as a polishing pad of a type different from the non-woven fabric-type polishing pad. The polishing pad composed mainly of a polymer foam has a higher hardness than the non-woven fabric-type polishing pad, and thus exhibits an excellent planarization performance. Since the polishing pad composed mainly of a polymer foam has a closed-cell structure, abrasive grains and polishing debris cannot easily enter deeply into the voids unlike the case of the non-woven fabric-type polishing pad. Therefore, abrasive grains and polishing debris can be relatively easily removed by washing, resulting in a relatively long life. As the polishing pad composed mainly of a polymer foam, for example, polishing pads as disclosed in PTLs 1 to 6 below are known that include, as a polishing layer, a foamed polyurethane molded article obtained by foaming and molding a two-liquid curable polyurethane by casting. The foamed polyurethane molded article is preferably used as a polishing layer due to its excellent abrasion resistance.

Semiconductor devices include integrated circuits with a high level of integration and multilayered interconnections. Polishing pads used for a planarization process for semiconductor devices are required to exhibit a higher planarization performance. A polishing pad that exhibits a high planarization performance is a polishing pad that offers a high polishing rate for a portion to be polished and a low polishing rate for a portion that is not to be polished. The polishing pad that exhibits a high planarization performance is required to have a high hardness. A polishing pad including a foamed polyurethane molded article as a polishing layer exhibits a high planarization performance because the polishing layer has a relatively high hardness.

With a further increase in the level of integration and the number of multilayered interconnections in semiconductor devices in recent years, there is a need for a polishing pad that exhibits an even higher planarization performance. In the case of using a polishing pad including a foamed polyurethane molded article as a polishing layer, it has been difficult to achieve a high planarization performance by further increasing the hardness of the polishing layer. In order to provide a polishing pad that offers an even higher planarization performance, for example, PTLs 7 and 8 below disclose high-hardness polishing pads composed mainly of an unfoamed resin.

CITATION LIST

Patent Literatures

[PTL 1] Japanese Laid-Open Patent Publication No. 2000-178374
[PTL 2] Japanese Laid-Open Patent Publication No. 2000-248034
[PTL 3] Japanese Laid-Open Patent Publication No. 2001-89548
[PTL 4] Japanese Laid-Open Patent Publication No. H11-322878
[PTL 5] Japanese Laid-Open Patent Publication No. 2002-371154
[PTL 6] WO 2007/034980
[PTL 7] Japanese Laid-Open Patent Publication No. 2014-038916
[PTL 8] Japanese Laid-Open Patent Publication No. 2009-101487

SUMMARY OF INVENTION

Technical Problem

Usually, a polishing pad used for CMP is provided with grooves or holes (hereinafter also collectively referred to as "recesses") for allowing a slurry to be uniformly and sufficiently supplied to the surface to be polished of a material to be polished. Such recesses are also useful to discharge the polishing debris that may cause scratching and to prevent a damage to a wafer as a result of absorption of the polishing pad.

In the case of forming recesses on the polishing surface of a high-hardness polishing layer composed mainly of a non-porous resin (unfoamed resin), there has been a problem that a material to be polished or a conditioner repeatedly comes into contact with corner portions (end portions, shoulder portions) of the recesses for a long period of time, thus generating burrs at the corner portions over time. Then, the generated burrs gradually clog the recesses, which gradually reduces the amount of slurry supplied. This has resulted in a problem of a gradual reduction in the polishing rate and the polishing uniformity.

It is an object of the present invention to provide a polishing layer of a polishing pad in which generation of burrs at corner portions of recesses formed in a polishing surface can be suppressed.

Solution to Problem

The present inventors have noticed that when a molded article of a thermoplastic polyurethane having a low impact resilience and a high toughness is used as a polishing layer, the force that is repeatedly applied to the corner portions of the recesses causes the thermoplastic polyurethane to be easily stretched, so that burrs are likely to be generated. The inventors also have gained the knowledge that burrs are less likely to be generated in the case of using a thermoplastic polyurethane including a soft segment and a hard segment that are highly compatible. Based on this knowledge, the inventors have found a specific thermoplastic polyurethane that is less likely to generate burrs and has moderate impact resilience and toughness, and has arrived at the present invention.

That is, an aspect of the present invention is directed to a non-porous molded article for a polishing layer (hereinafter also simply referred to as "non-porous molded article"), the non-porous molded article including a thermoplastic polyurethane, wherein the thermoplastic polyurethane has a maximum value of a loss tangent (tan δ) in a range of −70 to −50° C. of $4.00 \times 10^{-2}$ or less. In the case where such a non-porous molded article is used as a polishing layer, burrs are less likely to be generated at corner portions of recesses formed in the polishing surface even after CMP polishing is performed for a long period of time. The present inventors presume that generation of burrs can be suppressed in a polishing pad using such a non-porous molded article as a polishing layer by the following mechanism. A thermoplastic polyurethane having a high tan δ value in a low-temperature region tends to be deformed and to have a high toughness. The polishing surface is subjected to a high-frequency impact, for example, by coming into contact with the diamond particles of the conditioner. The damping characteristics of the polishing pad for a high-frequency impact correlate with the tan δ in a low-temperature region. A thermoplastic polyurethane having a low tan δ value in a low-temperature region has a low impact resistance and a low toughness, and is brittle. Accordingly, the thermoplastic polyurethane wears out at the corner portions of the recesses before burrs are generated, so that the generation of burrs can be suppressed. Then, with a polishing layer in which generation of burrs is suppressed, a slurry can be uniformly supplied onto the entire polishing surface for a long period of time. Accordingly, a uniform polishing rate is achieved at various points on the surface to be polished of a material to be polished such as a wafer. As a result, it is possible to achieve polishing with excellent polishing uniformity.

It is preferable that the thermoplastic polyurethane is obtained by polymerization of a polymer diol having a number average molecular weight of 650 to 1400, an organic diisocyanate, and a chain extender, and a content ratio of nitrogen derived from an isocyanate group of the organic diisocyanate is 5.7 to 6.5 mass %. This is preferable because a thermoplastic polyurethane including a soft segment and a hard segment that are highly compatible, and having a maximum value of a loss tangent in the range of −70 to −50° C. of $4.00 \times 10^{-2}$ or less can be easily obtained.

It is preferable that the thermoplastic polyurethane, in a form of a sheet having a thickness of 0.5 mm, has a laser transmittance at a laser wavelength of 660 nm of 70% or more. Such a thermoplastic polyurethane includes a soft segment and a hard segment that are highly compatible. With such a thermoplastic polyurethane, a non-porous molded article of a thermoplastic polyurethane that has a maximum value of a loss tangent in the range of −70 to −50° C. of $4.00 \times 10^{-2}$ or less can be easily obtained. Since the laser transmittance is 70% or more, such a thermoplastic polyurethane is preferable also in that it is suitable for an inspection using optical means in which an end point of polishing is determined or the material to be polished is inspected, while polishing the surface to be polished of a material to be polished such as a wafer.

It is preferable that the thermoplastic polyurethane has a tensile modulus after swollen to saturation with 50° C. warm water of 130 to 800 MPa, since a polishing layer having a hardness high enough to suppress the occurrence of scratching during polishing can be obtained. When the hardness of the polishing pad is lowered over time, the planarization performance tends to be decreased, or the polishing efficiency tends to be reduced.

It is preferable that the thermoplastic polyurethane, in a form of a sheet, has a contact angle with water of 80 degrees or less, from the viewpoint of suppressing the occurrence of scratching.

It is preferable that the thermoplastic polyurethane has a tensile modulus retention when swollen to saturation with water of 55% or more, the tensile modulus retention being calculated by the following expression: A/B×100, where A represents a tensile modulus when swollen to saturation with 50° C. warm water, and B represents a tensile modulus when not swollen to saturation, since the polishing characteristics are less likely to change over time during polishing.

Another aspect of the present invention is directed to a polishing pad including any one of the above-described non-porous molded articles for a polishing layer as a polishing layer. With such a polishing pad, it is possible to achieve polishing with excellent polishing uniformity.

It is preferable that the polishing pad includes the polishing layer; and a cushioning layer stacked on the polishing layer and having a hardness lower than a hardness of the polishing layer, since a polished surface that is well-balanced in the global planarization performance and the local planarization performance can be formed.

Another aspect of the present invention is directed to a chemical mechanical polishing method using the above-described polishing pad.

Advantageous Effects of Invention

According to the present invention, it is possible to obtain a polishing layer in which burrs are less likely to be generated at corner portions of recesses formed in a polishing surface even after CMP polishing performed for a long period of time.

DESCRIPTION OF EMBODIMENT

Hereinafter, a non-porous molded article for a polishing layer, a polishing pad, and a polishing method according to an embodiment of the present invention will be described in detail.

A non-porous molded article for a polishing layer of the present embodiment is a non-porous molded article (unfoamed molded article) of a thermoplastic polyurethane, wherein the thermoplastic polyurethane has a maximum value of a loss tangent (tan δ) in a range of −70 to −50° C. of $4.00 \times 10^{-2}$ or less.

The thermoplastic polyurethane of the present embodiment has a maximum value of a loss tangent in the range of −70 to −50° C. of $4.00 \times 10^{-2}$ or less, preferably $3.50 \times 10^{-2}$ or less, more preferably $3.00 \times 10^{-2}$ or less. Such a thermoplastic polyurethane includes a soft segment and a hard segment that are highly compatible, and has a high impact resilience and a low toughness. When the upper limit of the maximum value of the loss tangent in the range of −70 to −50° C. of the thermoplastic polyurethane exceeds $4.00 \times 10^{-2}$, the resulting thermoplastic polyurethane has a low impact resilience and a high toughness. In this case, burrs tend to be generated during polishing at corner portions (end portions, shoulder portions) of recesses formed in the polishing surface. As a result, the polishing efficiency is reduced. The loss tangent of the thermoplastic polyurethane in the range of −70 to −50° C. is preferably $2.00 \times 10^{-2}$ or less. In such a case, a thermoplastic polyurethane having moderate impact resilience, toughness and hardness can be obtained. As a result, the polishing uniformity tends to be enhanced.

The thermoplastic polyurethane having a maximum value of a loss tangent in the range of −70 to −50° C. of $4.00 \times 10^{-2}$ or less can be obtained by using a thermoplastic polyurethane having a content ratio of nitrogen derived from a urethane bond of 5.7 to 6.5 mass %, the thermoplastic polyurethane being obtained by polymerization of a polymer diol having a number average molecular weight of 650 to 1400, an organic diisocyanate, and a chain extender.

The number average molecular weight of the polymer diol used for the polymerization of the thermoplastic polyurethane is preferably 650 to 1400, more preferably 800 to 1200, particularly preferably 800 to 1000. When the number average molecular weight of the polymer diol is too low, the planarization performance of the polishing layer tends to be reduced as a result of the reduction in hardness or tensile modulus. On the other hand, when the number average molecular weight of the polymer diol is too high, the maximum value of the loss tangent exceeds $4.00 \times 10^{-2}$ due to phase separation of the soft segment and the hard segment, so that a thermoplastic polyurethane having a low impact resilience and a high toughness is likely to be obtained. As a result, burrs are likely to be generated at the corner portions of the recesses during polishing. Here, the number average molecular weight of the polymer diol refers to a number average molecular weight calculated based on the hydroxyl value measured in accordance with JIS K 1557.

Examples of the polymer diol include polyether diol, polyester diol, and polycarbonate diol.

Examples of the polyether diol include polyethylene glycol, polypropylene glycol, polytetramethylene glycol, polymethyltetramethylene glycol, polyoxypropylene glycol, and glycerin-based polyalkylene ether glycol. These may be used alone or in a combination of two or more. Among these, polyethylene glycol and polytetramethylene glycol are particularly preferable.

Examples of the polyester diol include a polyester diol obtained by esterification reaction directly or a transesterification reaction between a dicarboxylic acid or an ester-forming derivative thereof (e.g., an ester, anhydride, etc.) and a low-molecular weight diol.

Examples of the dicarboxylic acid include aliphatic dicarboxylic acids, including, for example, C2-12 aliphatic dicarboxylic acids such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid and 3,7-dimethyldecanedioic acid; and also C14-48 dimerized aliphatic dicarboxylic acids (dimer acids) obtained by the dimerization of unsaturated fatty acids obtained by the fractional distillation of triglycerides, as well as the hydrogenated products from these C14-48 dimerized aliphatic dicarboxylic acids (hydrogenated dimer acids); alicyclic dicarboxylic acids such as 1,4-cyclohexanedicarboxylic acid; and aromatic dicarboxylic acids such as terephthalic acid, isophthalic acid and ortho-phthalic acid. Examples of the dimer acid and the hydrogenated dimer acid include "Pripol 1004", "Pripol 1006", "Pripol 1009", and "Pripol 1013" (trade names, manufactured by Unichema). These may be used alone or in a combination of two or more.

Specific examples of the low-molecular weight diol include aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol and 1,10-decanediol; and alicyclic diols such as cyclohexanedimethanol and cyclohexanediol. These may be used alone or in a combination of two or more. Among these, C6-12 diols are preferable, C8-10 diols are more preferable, and C9 diols are particularly preferable.

Examples of the polycarbonate diol include a polycarbonate diol obtained by reaction between a carbonate compound and a low-molecular weight diol.

Specific examples of the carbonate compound include dialkyl carbonates such as dimethyl carbonate and diethyl carbonate, alkylene carbonates such as ethylene carbonate, and diaryl carbonates such as diphenyl carbonate. Examples of the low-molecular weight diol include the same low-molecular weight diols as those described above. These may be used alone or in a combination of two or more.

The polymer diols may be used alone or in a combination of two or more. Among them, it is preferable to use at least one selected from the group consisting of polyether diols selected from polyethylene glycol and polytetramethylene glycol; polyester diols selected from poly(nonamethylene adipate), poly(2-methyl-1,8-octamethylene adipate), poly(2-methyl-1,8-octamethylene-co-nonamethylene adipate) and poly(methylpentane adipate); or derivatives thereof, since they have excellent hydrophilicity.

As the organic diisocyanate used for the polymerization of the thermoplastic polyurethane, any of the organic diisocyanates conventionally used for the polymerization of a thermoplastic polyurethane can be used without any particular limitation. Specific examples thereof include aliphatic and alicyclic diisocyanates such as ethylene diisocyanate, tetramethylene diisocyanate, pentamethylene diisocyanate, hexamethylene diisocyanate, 2,2,4- or 2,4,4-trimethylhexamethylene diisocyanate, dodecamethylene diisocyanate, isophorone diisocyanate, isopropylidenebis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl)fumarate, bis(2-isocyanatoethyl)carbonate, 2-isocyanatoethyl-2,6-diisocyanatohexanoate, cyclohexylene diisocyanate, methylcyclohexylene diisocyanate and bis(2-isocyanatoethyl)-4-cyclohexene; and aromatic diisocyanates such as 2,4'- or 4,4'-diphenylmethane diisocyanate, 2,4- or 2,6-tolylene diisocyanate, m- or p-phenylene diisocyanate, m- or p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate and tetramethylxylylene diisocyanate. These may be used alone or in a combination of two or more. Among these, at least one selected from the group consisting of 4,4'-diphenylmethane diisocyanate, 2,4-tolylene diisocyanate, 2,6-tolylene diisocyanate and isophorone diisocyanate is preferable, and 4,4'-diphenylmethane diisocyanate is particularly preferable, since a polishing layer having excellent abrasion resistance can be provided.

Examples of the chain extender used for the polymerization of the thermoplastic polyurethane include a low-molecular weight compound that has been conventionally used for the polymerization of a thermoplastic polyurethane, the low-molecular weight compound having, in the molecule, two or more active hydrogen atoms capable of reacting with an isocyanate group and having a molecular weight of preferably 300 or less. Specific examples thereof include diols such as ethylene glycol, diethylene glycol, propylene glycol, 2,2'-diethyl-1,3-propanediol, 1,2-butanediol, 1,3-butanediol, 2,3-butanediol, 1,4-butanediol, 1,5-pentanediol, neopentyl glycol, 1,6-hexanediol, 3-methyl-1,5-pentanediol, 1,4-bis(β-hydroxyethoxy)benzene, 1,4-cyclohexanediol, bis-(β-hydroxyethyl)terephthalate, 1,9-nonanediol, m-xylylene glycol and p-xylylene glycol; and diamines such as ethylenediamine, trimethylenediamine, tetramethylenediamine, hexamethylenediamine, heptamethylenediamine, octamethylenediamine, nonamethylenediamine, decamethylenediamine, undecamethylenediamine, dodecamethylenediamine, 2,2',4-trimethylhexamethylenediamine, 2,4,4'-trimethylhexamethylenediamine, 3-methylpentamethylenediamine, 1,2-cyclohexanediamine, 1,3-cyclohexanediamine, 1,4-cyclohexanediamine, 1,2-diaminopropane, 1,3-diaminopropane, hydrazine, xylylenediamine, isophoronediamine, piperazine, o-phenylenediamine, m-phenylenediamine, p-phenylenediamine, tolylenediamine, xylylenediamine, adipic acid dihydrazide, isophthalic acid dihydrazide, 4,4'-diaminodiphenylmethane, 4,4'-diaminodiphenyl ether, 4,4'-bis(4-aminophenoxy)biphenyl, 4,4'-bis(3-aminophenoxy)biphenyl, 1,4'-bis(4-aminophenoxy)benzene, 1,3'-bis(4-aminophenoxy)benzene, 1,3-bis(3-aminophenoxy)benzene, 3,4-diaminodiphenyl ether, 4,4'-diaminodiphenyl sulfone, 3,4-diaminodiphenyl sulfone, 3,3'-diaminodiphenyl sulfone, 4,4'-methylene-bis(2-chloroaniline), 3,3'-dimethyl-4,4'-diaminobiphenyl, 4,4'-diaminodiphenyl sulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, R(+)-2,2'-diamino-1,1'-binaphthalene, S(+)-2,2'-diamino-1,1'-binaphthalene, 1,n-bis(4-aminophenoxy)alkane (n is 3 to 10), e.g., 1,3-bis(4-aminophenoxy)alkane, 1,4-bis(4-aminophenoxy)alkane and 1,5-bis(4-aminophenoxy)alkane), 1,2-bis [2-(4-aminophenoxy)ethoxy]ethane, 9,9'-bis(4-aminophenyl)fluorene and 4,4'-diaminobenzanilide. These may be used alone or in a combination of two or more. Among these, at least one selected from the group consisting of 1,3-propanediol, 1,4-butanediol, neopentyl glycol, 1,5-pentanediol, 1,6-hexanediol, and cyclohexanedimethanol is preferable.

The blending ratio of the polymer diol, the chain extender, and the organic diisocyanate as the components of the monomer used for the polymerization of the thermoplastic polyurethane may be appropriately selected taking into consideration the desired physical properties such as abrasion resistance. Specifically, for example, the ratio is preferably such that the amount of the isocyanate group contained in the organic diisocyanate is preferably 0.95 to 1.3 moles, more preferably 0.96 to 1.10 moles, particularly preferably 0.97 to 1.05 moles, per mole of the active hydrogen atoms contained in the polymer diol and the chain extender, from the viewpoint of excellent mechanical strength and abrasion resistance of the thermoplastic polyurethane as well as excellent productivity and storage stability of the thermoplastic polyurethane. When the ratio of the isocyanate group is too low, the mechanical strength and abrasion resistance of the non-porous molded article tend to be reduced. When the ratio is too high, the productivity and storage stability of the thermoplastic polyurethane tend to be reduced.

As for the mass ratio of the polymer diol, the organic diisocyanate, and the chain extender, (the amount of the polymer diol)/(the total amount of the organic diisocyanate and the chain extender) is preferably 15/85 to 45/55, more preferably 20/80 to 40/60, particularly preferably 25/75 to 35/65.

The thermoplastic polyurethane in the present embodiment is obtained by polymerization through a urethanation reaction using a known prepolymer method or one-shot method by using, for example, a monomer containing a polymer diol having a number average molecular weight of 650 to 1400, an organic diisocyanate, and a chain extender. It is preferable to use a method in which continuous melt-polymerization is performed substantially in the absence of a solvent by using a single-screw or multi-screw extruder, while melt-mixing the above-described monomer.

The content ratio of nitrogen derived from the isocyanate group of the organic diisocyanate of the thermoplastic polyurethane is preferably 5.7 to 6.5 mass %, more preferably 5.7 to 6.1 mass %. When the content ratio of nitrogen derived from the isocyanate group of the organic diisocyanate is too low, in the case of using the non-porous molded article of the thermoplastic polyurethane as a polishing layer, the polishing layer will be too soft so that the planarization performance and the polishing efficiency tend to be reduced. On the other hand, when the content ratio of nitrogen derived from the isocyanate group of the organic diisocyanate is too high, the maximum value of the loss tangent at −70 to −50° C. will be likely to exceed $4.00 \times 10^{-2}$.

The thermoplastic polyurethane, in the form of a sheet having a thickness 0.5 mm, has a laser transmittance at a laser wavelength of 660 nm of preferably 70% or more, more preferably 80% or more, particularly preferably 90% or more. Here, the laser transmittance at a laser wavelength of 660 nm refers to a value measured under the following conditions: laser wavelength (660 nm), laser output (310 μW), distance between a detection head and an output head (100 mm), and sample position (an intermediate point between the detection head and the output head). When the laser transmittance is too low, the maximum value of the loss tangent at −70 to −50° C. is likely to be higher than 4.00×10⁻² since the soft segment and the hard segment of the thermoplastic polyurethane are likely to undergo phase separation. Therefore, the thermoplastic polyurethane is likely to have a low impact resilience and a high toughness, so that burrs that may clog the recesses formed in the polishing surface tend to be generated over time. On the other hand, when the laser transmittance is too low, it tends to be difficult to use the thermoplastic polyurethane in inspection of the material to be polished or detection of the end point of polishing.

The thermoplastic polyurethane has a tensile modulus after swollen to saturation with 50° C. water of preferably 130 to 800 MPa, more preferably 180 to 750 MPa, particularly preferably 230 to 700 MPa, further preferably 280 to 650 MPa. When the tensile modulus after swollen to saturation with 50° C. water is too low, the polishing layer tends to be soft, resulting in a reduction in the planarization performance and the polishing efficiency. On the other hand, when the tensile modulus after swollen to saturation with 50° C. water is too high, scratching tends to easily occur in a surface to be polished.

The thermoplastic polyurethane in the present embodiment has a tensile modulus retention when swollen to saturation with water of preferably 55% or more, more preferably 60% or more, particularly preferably 75% or more, the tensile modulus retention being calculated by the following expression (1):

$$A/B \times 100 \qquad (1),$$

where A represents a tensile modulus when swollen to saturation with 50° C. warm water and B represents a tensile modulus when not swollen to saturation with 50° C. warm water. When the tensile modulus retention when swollen to saturation with water is too low, the polishing layer undergoes significant changes in characteristics due to moisture. For example, the polishing rate tends to be easily reduced when the pad is left in a damp state for several hours to several days after polishing has been finished.

It is preferable that the non-porous molded article of the present embodiment is produced in the form of a sheet by subjecting the above-described thermoplastic polyurethane free of components such as a foaming agent to extrusion molding using a T-die or injection molding. In particular, a sheet obtained by extrusion molding using a T-die is preferable since a sheet having a uniform thickness can be obtained.

The thickness of the sheet is not particularly limited, and may be appropriately adjusted according to the layer configuration or the usage of the polishing pad. Specifically, the thickness of the sheet is preferably 1.5 to 3.0 mm, more preferably 1.7 to 2.8 mm, particularly 2.0 to 2.5 mm.

The sheet has a contact angle with water of preferably 80 degrees or less, more preferably 75 degrees or less, particularly preferably 70 degrees or less. When the contact angle with water is too high, scratching tends to easily occur in a surface to be polished.

Furthermore, the sheet has a JIS-D hardness of preferably 55 or more, more preferably 60 to 80, particularly preferably 65 to 75. When the JIS-D hardness is too low, the local planarization performance tends to be reduced. When the JIS-D hardness is too high, scratching tends to easily occur.

A polishing pad of the present embodiment includes a polishing layer formed, for example, by cutting out a sheet having a circular shape or the like from the sheet of the non-porous molded article as described above. The polishing pad may be either a monolayer polishing pad of the sheet of the non-porous molded article, or a multilayer polishing pad in which a cushioning layer is stacked on the sheet of the non-porous molded article.

It is preferable that the cushioning layer has a hardness lower than the hardness of the polishing layer. When the hardness of the cushioning layer is lower than the hardness of the polishing layer, the hard polishing layer is likely to follow local irregularities on a surface to be polished, and the cushioning layer follows the warpage and undulations on the entire material to be polished, making it possible to achieve polishing that is well-balanced in the global planarization performance and the local planarization performance.

Specific examples of materials that can be used as the cushioning layer include composites obtained by impregnating a known non-woven fabric with a polyurethane; rubbers such as natural rubber, nitrile rubber, polybutadiene rubber and silicone rubber; thermoplastic elastomers such as polyester thermoplastic elastomers, polyamide thermoplastic elastomers and fluorine thermoplastic elastomers; foamed plastics; and polyurethanes. Among these, a polyurethane having a foam structure is particularly preferable because of its moderate flexibility.

The thickness of the cushioning layer is not particularly limited, and is preferably about 0.3 to 1.2 mm, more preferably about 0.5 to 1.0 mm, for example. When the cushioning layer is too thin, the property of following the warpage and undulations on the entire material to be polished tends to be reduced, resulting in a reduction in the global planarization performance of the polishing pad. On the other hand, when the cushioning layer is too thick, the polishing pad as a whole will become soft, making it difficult for polishing to be performed in a stable manner.

Usually, recesses such as grooves or holes are formed concentrically in the polishing surface of the polishing layer in the polishing pad of the present embodiment in order to allow a slurry to be uniformly and sufficiently supplied to the polishing surface. Such recesses are also useful to discharge of polishing debris that may cause scratching and to prevent a damage to a wafer as a result of absorption of the polishing pad.

The method for forming the recesses in the polishing surface is not particularly limited. Specific examples thereof include a method in which the surface of the sheet of the non-porous molded article is subjected to cutting so as to form a predetermined pattern of recesses in the polishing surface of the polishing layer, a method in which recesses are formed by performing transferring using a mold during injection molding, and a method in which recesses are formed by stamping using a heated die.

For example, in the case of forming grooves concentrically, the interval between the grooves is preferably about 2.0 to 50 mm, more preferably about 5.5 to 30 mm, particularly preferably about 6.0 to 15 mm. The width of the grooves is preferably about 0.1 to 3.0 mm, more preferably about 0.4 to 2.0 mm. The depth of the grooves is preferably about 0.2 to 1.8 mm, more preferably about 0.4 to 1.5 mm. The cross-sectional shape of the grooves may be appropriately selected from, for example, a rectangular shape, a trapezoidal shape, a triangular shape, and a semicircular shape according to the purpose.

In the case where recesses are formed in the polishing surface, burrs may be generated at corner portions (shoulder portions, end portions) of the recesses as a result of a material to be polished or a conditioner repeatedly coming into contact with the corner portions for a long period of time. Also, such burrs gradually clog the recesses, which gradually reduces the amount of slurry supplied. This results in a gradual reduction in the polishing rate and the polishing uniformity. The polishing layer using the non-porous molded article of the thermoplastic polyurethane of the present embodiment suppresses the generation of such burrs that may clog the recesses.

Figure 1:
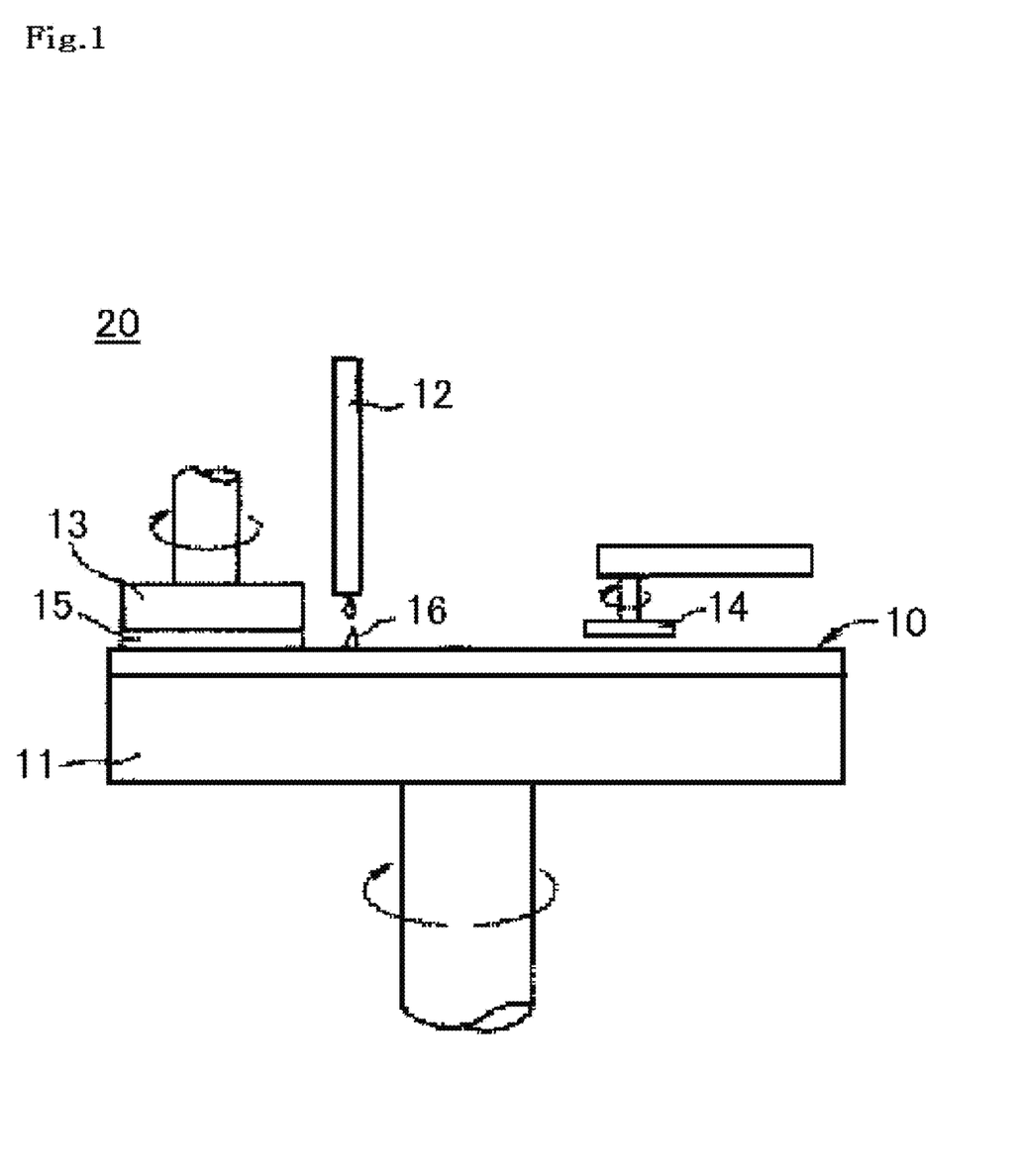
FIG. 1 is an explanatory diagram illustrating CMP using a polishing pad.
Figure 2:
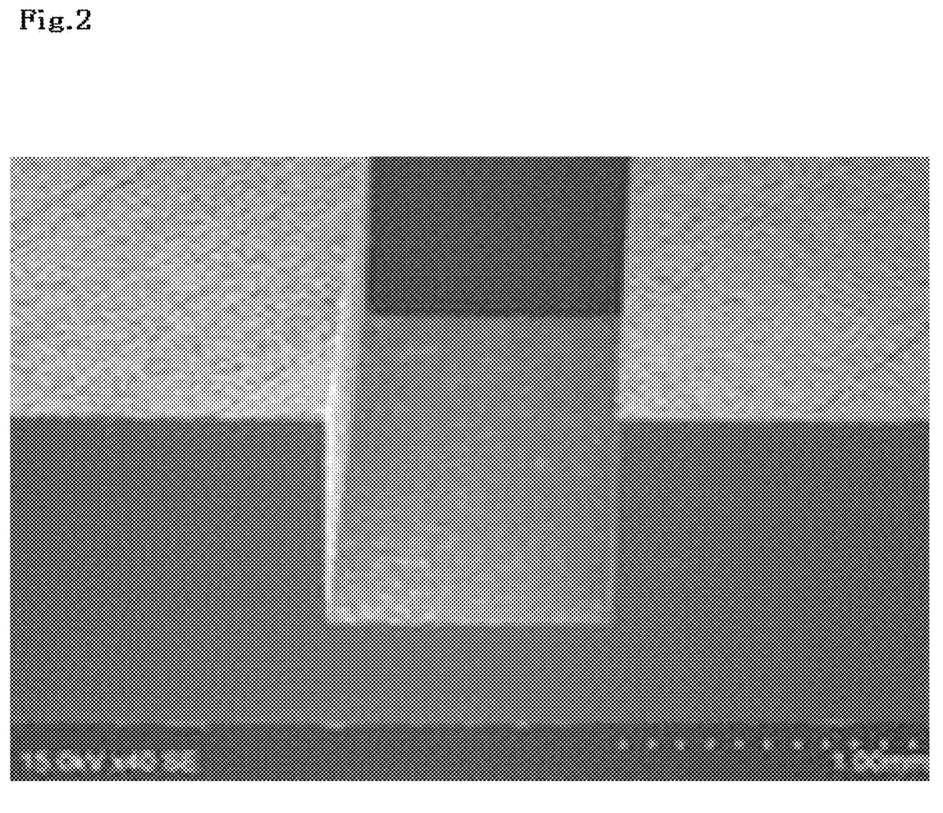
FIG. 2 is a scanning electron microscope (SEM) photograph of a cross section of a polishing layer taken after an 8-hour accelerated dressing test using a polishing pad produced in Example 1.

An embodiment of CMP using the polishing pad of the present embodiment will be described. In CMP, a CMP apparatus 20 including a circular rotary platen 11, a slurry supply nozzle 12, a carrier 13, and a pad conditioner 14 as shown in FIG. 1 is used, for example. A polishing pad 10 is attached to the surface of the rotary platen 11 by means of double-sided tape or the like. The carrier 13 supports a material to be polished 15.

In the CMP apparatus 20, the rotary platen 11 is rotated by a motor (not shown) in the direction indicated by the arrow. The carrier 13 is rotated, in the plane of the rotary platen 11, by a motor (not shown), for example, in the direction indicated by the arrow. The pad conditioner 14 is also rotated, in the plane of the rotary platen 11, by a motor (not shown), for example, in the direction indicated by the arrow.

First, while pouring distilled water onto a polishing surface of the polishing pad 10 that is fixed to the rotary platen 11 and is rotated, the rotating pad conditioner 14 is pressed against the polishing surface of the polishing pad 10 so as to condition the polishing surface. As the pad conditioner, it is possible to use, for example, a conditioner in which diamond particles are fixed onto the surface of a carrier by electrodeposition of nickel or the like. In this manner, adjustment is performed such that the polishing surface of the polishing layer of the polishing pad 10 has a surface roughness suitable for polishing of the surface to be polished. Next, a polishing slurry 16 is supplied from the slurry supply nozzle 12 to the polishing surface of the polishing layer of the rotating polishing pad 10. The polishing slurry 16 contains, for example, a liquid medium such as water or oil; an abrasive such as silica, alumina, cerium oxide, zirconium oxide or silicon carbide; a base; an acid; a surfactant; an oxidizing agent; a reducing agent; and a chelating agent. At the time of performing CMP, a lubricating oil, a coolant, and the like may be optionally used in combination with the polishing slurry. Then, the material to be polished 15 that is fixed to the carrier 13 and is rotated is pressed against the polishing pad 10 that is evenly wetted with the polishing slurry 16. Then, the polishing treatment is continued until a predetermined flatness is achieved. Adjustment of the pressing force applied during polishing or the speed of relative movement between the rotary platen 11 and the carrier 13 affects the finishing quality.

Although the polishing conditions are not particularly limited, the rotational speed of each of the platen and the substrate is preferably as low as 300 rpm or less, in order to efficiently perform polishing. The pressure applied to the substrate is preferably 150 kPa or less, in order to suppress the occurrence of scratching. While polishing is performed, it is preferable that the polishing slurry is continuously supplied to the polishing surface. The amount of the polishing slurry supplied is preferably an amount sufficient to allow the entire polishing surface to be constantly wetted with the polishing slurry.

Then, after the polished material that has undergone polishing is fully washed with running water, it is preferable to dry the polished material by removing water droplets attached thereto by using a spin drier or the like. In this manner, a flat surface can be achieved on the entirety of the polished surface as a result of polishing the surface to be polished with the polishing slurry.

Such CMP according to the present embodiment can be preferably used for polishing performed during the production process of various semiconductor devices, MEMS (MicroElectro Mechanical Systems), and the like. Examples of the material to be polished include semiconductor wafers such as a silicon wafer, a silicon oxide wafer and a silicon oxyfluoride wafer; inorganic insulating films formed on a wiring board having predetermined wiring, such as a silicon oxide film, a glass film and a silicon nitride film; films mainly containing polysilicon, aluminum, copper, titanium, titanium nitride, tungsten, tantalum, tantalum nitride and the like; optical glass products such as a photomask, a lens and a prism; inorganic conductive films such as a tin-doped indium oxide (ITO) film; optical integrated circuits, optical switching elements optical waveguides and end faces of optical fiber composed of glass and a crystalline material; optical single crystals such as a scintillator; solid-state laser single crystals; sapphire substrates for blue laser LEDs; semiconductor single crystals such as silicon carbide, gallium phosphide and gallium arsenide; glass substrates for magnetic disks; magnetic heads and the like; and synthetic resins such as a methacrylate resin and a polycarbonate resin.

EXAMPLES

Hereinafter, the present invention will be described in further detail by way of examples. It should be appreciated that the scope of the invention is by no means limited to the examples.

Example 1

A polytetramethylene glycol (PTMG 850) having a number average molecular weight of 850, 1,4-butanediol (BD), and 4,4'-diphenylmethane diisocyanate (MDI) were mixed at a ratio of PTMG 850:BD:MDI=32.5:15.6:51.9 (mass ratio), to prepare a prepolymer thereof. Then, the obtained prepolymer was kneaded in a small-sized kneader for 5 minutes at 240° C. and a screw speed of 100 rpm, to obtain a thermoplastic polyurethane A. Then, the thermoplastic polyurethane A was evaluated according to the following evaluation methods.

<Maximum Value of Loss Tangent (tan δ) in Range of −70 to −50° C.>

Figure 4:
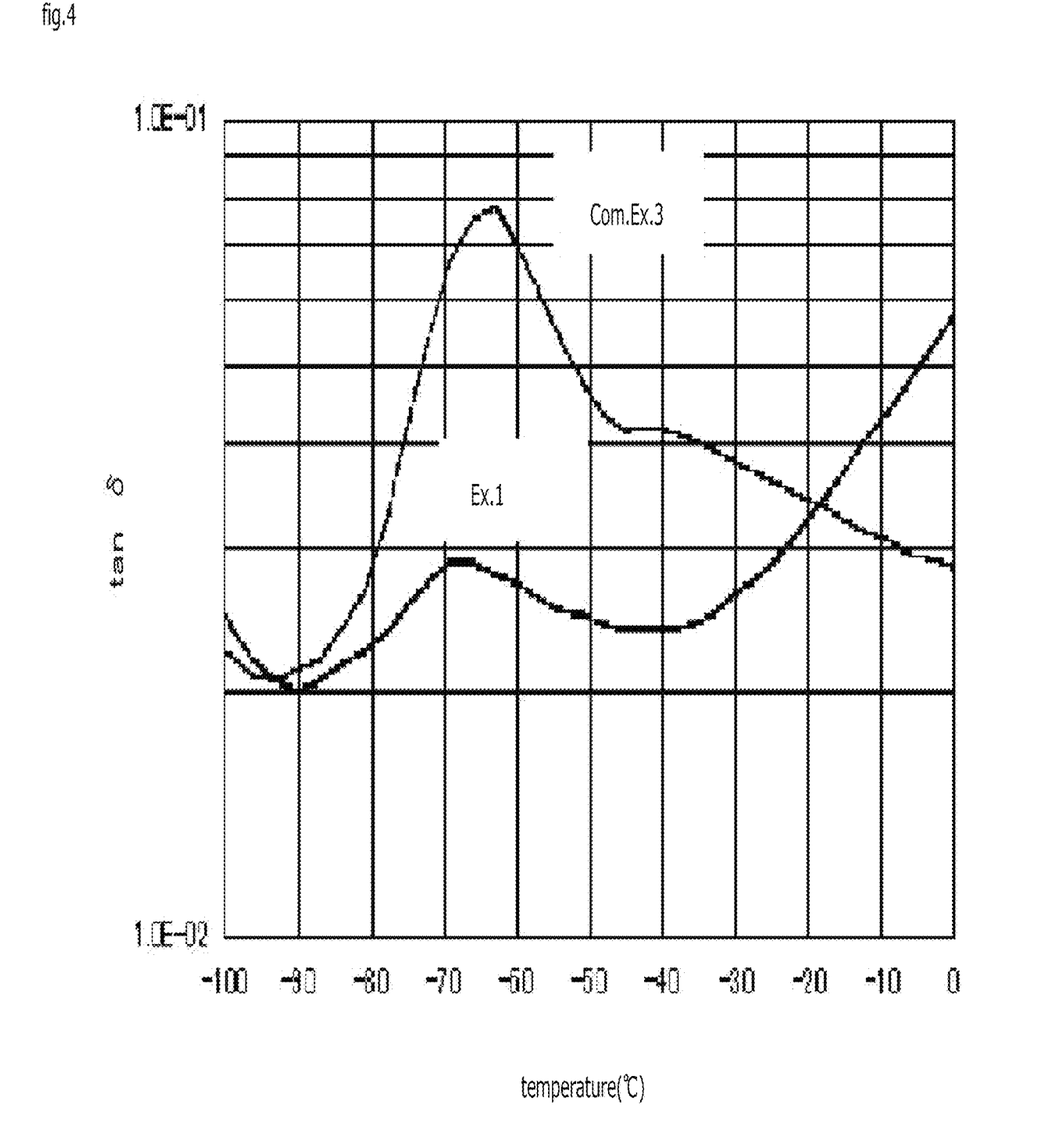
FIG. 4 is a chart showing results of measuring the loss tangent (tan δ) of the thermoplastic polyurethanes used in Example 1 and Comparative example 3, including the range of 70 to −50° C.

The thermoplastic polyurethane A was sandwiched between two metal plates, and hot press-molded by using a hot press-molding machine (a bench-type test press manufactured by SHINTO Metal Industries Corporation). In the hot press-molding, preheating was performed at a heating temperature of 230° C. for 2 minutes, and thereafter pressing was performed for 1 minute at a pressing pressure sufficient to give a thickness of 300 μm. Then, after the two metal plates with the thermoplastic polyurethane A interposed therebetween were taken out from the hot press-molding machine and cooled, the press-molded sheet was removed. The obtained press-molded sheet was dried in a vacuum drier at 60° C. for 16 hours. Then, a test piece of 5.0×25 (mm) was cut out from the press-molded sheet. The temperature dependence of the dynamic viscoelastic modulus of the cut-out test piece in the range of −120 to 250° C. at a frequency of 1.59 Hz was determined by using a dynamic viscoelastic measurement device (DVE Rheospectra manufactured by Rheology Co., Ltd.). Then, from a chart of the determined temperature dependence of the dynamic viscoelastic modulus, a maximum value of the loss tangent (tan δ) in the range of −70 to −50° C. was determined. FIG. 4 shows the chart of the temperature dependence of the dynamic viscoelastic modulus.

<Light Transmittance of Thermoplastic Polyurethane Sheet>

A press-molded sheet was obtained in the same manner as in the production method used in the measurement of the loss tangent except that the thickness was changed to 0.5 mm (500 µm). Then, a piece having a predetermined size was cut out from the press-molded sheet, and the light transmittance at a wavelength of 660 nm of the obtained piece was measured under the following conditions:

Spectral transmittance measurement device: "U-40008 spectrometer" manufactured by Hitachi, Ltd.
Laser wavelength: 660 nm
Laser output: 310 µW
Distance between detection head and output head: 10 cm
Measurement position of test piece: Intermediate position between detection head and output head <Tensile Modulus when Swollen with Water and Tensile Modulus Retention when Swollen with Water>

A No. 2-type test piece (JIS K 7113) was punched out from a press-molded sheet similar to the one used in the measurement of the loss tangent. Then, the test piece was left at 20° C. and 65% RH for 3 days to adjust the state of the test piece.

On the other hand, another No. 2-type test piece was swollen to saturation with water by being immersed in 50° C. warm water for 48 hours. Then, water was wiped off from the surface of the No. 2-type test piece taken out from the warm water, and thereafter the test piece was left at 20° C. and 65% RH for 3 days to adjust the state of the test piece.

Then, each of the state-adjusted No. 2-type test pieces was subjected to the tensile modulus measurement. Each tensile modulus measurement was carried out using an Instron 3367 under the environmental conditions: 20° C. and 65% RH, a chuck interval of 40 mm, a tensile speed of 500 mm/min, and N=6.

Then, the tensile modulus after swollen to saturation with water was represented as A and the tensile modulus in a dry state, or in other words, when not swollen to saturation with water was represented as B, and the tensile modulus retention when swollen with water was calculated by the following expression (1):

$$A/B \times 100 \qquad (1),$$

where A represents the tensile modulus at 20° C. and 65% RH after swollen to saturation with 50° C. warm water, and B represents the tensile modulus at 20° C. and 65% RH before swollen to saturation.

<Contact Angle with Water>

The contact angle with water of a press-molded sheet similar to the one used in the measurement of the loss tangent was measured by using a DropMaster 500 manufactured by Kyowa Interface Science Co., Ltd.

<Measurement of Content Ratio of Nitrogen Derived from Isocyanate Group of Organic Diisocyanate>

First, a total nitrogen content was calculated by elementary analysis under the following conditions:

Apparatus: Fully automatic elemental analyzer 2400 series II (equipped with an autosampler as standard equipment) C.H.N.S/O analyzer, manufactured by PerkinElmer, Inc.
Electric furnace temperature: 975° C.
Sample amount: 2 mg
Combustion improver: None
Sample container: Tin foil (with combustion improving effect, a single sheet was used)
Standard substance for creating calibration curve: Sulfanilamide Next, the nitrogen atoms derived from the organic diisocyanate and the nitrogen atoms derived from the chain extender were detected by NMR measurement under the following conditions:

Device: Nuclear magnetic resonance device Lambda 500 manufactured by JEOL, Ltd.
Measurement conditions: Resonance frequency; 1H 500 MHz/Probe; TH5FG2
Solvent: DMSO-d6, Concentration; 5 wt %/vol
Measurement temperature: 80° C.
Number of times of integrations: 64 s Then, from the results of the elementary analysis and the NMR measurement, the content ratio of nitrogen derived from the isocyanate group of the organic diisocyanate was calculated.

<Accelerated Dressing Test>

A press-molded sheet was obtained in the same manner as in the production method used in the measurement of the loss tangent except that the thickness was changed to 2.0 mm. Then, a test piece of 20 mm×50 mm was cut out from the press-molded sheet. Grooves having a width of 1.0 mm and a depth of 1.0 mm were formed in the obtained test piece, to produce a polishing layer sheet. Then, a hole having the same shape as the test piece was formed in a polyurethane pad serving as a substrate, and the test piece was fitted into the hole, to obtain a polishing pad. The polishing pad was attached to an electric potter's wheel-type polishing machine (RK-3D type) manufactured by Nidec-Shimpo Corporation. Then, using a diamond dresser (grit number #100) manufactured by A.L.M.T. Corp., the surface of the polishing pad was ground for 8 hours at a dresser rotation rate of 61 rpm, a polishing pad rotation rate of 60 rpm, and a dresser load of 2.75 psi, while pouring a slurry at a rate of 150 mL/min. The ground polishing layer was visually observed, and the test piece in which no burr was generated was rated as good, and the test piece in which a slight amount of burrs were generated was rated as poor.

The results of the above-described evaluations are collectively shown in Table 1.

TABLE 1

| | | Example No. | | | | | | | |
|---|---|---|---|---|---|---|---|---|---|
| | | Ex. 1 | Ex. 2 | Ex. 3 | Com. Ex. 1 | Com. Ex. 2 | Com. Ex. 3 | Com. Ex. 4 | Com. Ex. 5 |
| Resin composition | Polymer polyol | PTMG 850 | PTMG 1000 | PTMG 850 | PTMG 850 | PTMG 1400 | PTMG 2000 | PTMG 2000/ PNOA 2000 | PTMG 2000/ PNOA 2000 |

TABLE 1-continued

| | Ex. 1 | Ex. 2 | Ex. 3 | Com. Ex. 1 | Com. Ex. 2 | Com. Ex. 3 | Com. Ex. 4 | Com. Ex. 5 |
|---|---|---|---|---|---|---|---|---|
| Chain extender | BD | BD | BD | BD/MPD | BD/MPD | BD/MPD | BD/CHDM | BD/CHDM |
| Organic diisocyanate | MDI | MDI | MDI | MDI | MDI | MDI | MDI | MDI |
| Content of nitrogen atoms derived from isocyanate group (mass %) | 5.8 | 5.7 | 6.1 | 6.7 | 5.6 | 5.6 | 5.6 | 6.1 |
| Maximum value of loss tangent in range of −50 to −70° C. ($10^{-2}$) | 2.86 | 2.64 | 3.40 | 4.10 | 4.21 | 7.88 | 9.63 | 6.77 |
| Tensile modulus A after swollen to saturation with 50° C. water (MPa) | 350 | 271 | 553 | 1300 | 330 | 706 | 900 | 1000 |
| Tensile modulus B (MPa) | 555 | 400 | 909 | 1600 | 500 | 810 | 900 | 1100 |
| Retention when swollen to saturation with water ((A/B) × 100) (%) | 63 | 68 | 61 | 81 | 66 | 87 | 89 | 91 |
| Laser transmittance (%) | 85 | 80 | 75 | 70 | 45 | 25 | 25 | 25 |
| Contact angle (deg.) | 70 | 70 | 70 | 70 | 70 | 70 | 71 | 71 |
| Accelerated dressing test (burr evaluation) | Good | Good | Good | Poor | Poor | Poor | Poor | Poor |

Example 2

A polytetramethylene glycol (PTMG 1000) having a number average molecular weight of 1000, BD, and MDI were mixed at a ratio of PTMG 1000:BD:MDI=32.0:16.2:51.8 (mass ratio), to prepare a prepolymer. Then, the obtained prepolymer was kneaded in a small-sized kneader for 5 minutes at 240° C. and a screw speed of 100 rpm, to obtain a thermoplastic polyurethane B.

The same evaluation as in Example 1 was performed except for using the thermoplastic polyurethane B in place of the thermoplastic polyurethane A. The results are shown in Table 1.

Example 3

A polytetramethylene glycol (PTMG 850) having a number average molecular weight of 850, BD, and MDI were mixed at a ratio of PTMG 850:BD:MDI=28.9:16.6:54.5 (mass ratio), to prepare a prepolymer. Then, the obtained prepolymer was kneaded in a small-sized kneader for 5 minutes at 240° C. and a screw speed of 100 rpm, to obtain a thermoplastic polyurethane C.

The same evaluation as in Example 1 was performed except for using the thermoplastic polyurethane C in place of the thermoplastic polyurethane A. The results are shown in Table 1.

Comparative Example 1

PTMG 850, BD, 3-methyl-1,5-pentanediol (MPD), and MDI were mixed at a ratio of PTMG 850:BD:MPD:MDI=18.5:15.0:6.6:59.9 (mass ratio), to prepare a prepolymer. Then, the obtained prepolymer was kneaded in a small-sized kneader for 5 minutes at 240° C. and a screw speed of 100 rpm, to obtain a thermoplastic polyurethane D.

The same evaluation as in Example 1 was performed except for using the thermoplastic polyurethane D in place of the thermoplastic polyurethane A. The results are shown in Table 1.

Comparative Example 2

A polytetramethylene glycol (PTMG 1400) having a number average molecular weight of 1400, BD, MPD, and MDI were mixed at a ratio of PTMG 1400:BD:MPD:MDI=32.4:12.2:5.4:50.0 (mass ratio), to prepare a prepolymer. Then, the obtained prepolymer was kneaded in a small-sized kneader for 5 minutes at 240° C. and a screw speed of 100 rpm, to obtain a thermoplastic polyurethane E.

The same evaluation as in Example 1 was performed except for using the thermoplastic polyurethane E in place of the thermoplastic polyurethane A. The results are shown in Table 1.

Comparative Example 3

A polytetramethylene glycol (PTMG 2000) having a number average molecular weight of 2000, BD, MPD, and MDI were mixed at a ratio of PTMG 2000:BD:MPD:MDI=31.7:12.7:5.6:50.0 (mass ratio), to prepare a prepolymer. Then, the obtained prepolymer was kneaded in a small-sized kneader for 5 minutes at 240° C. and a screw speed of 100 rpm, to obtain a thermoplastic polyurethane F.

Figure 3:
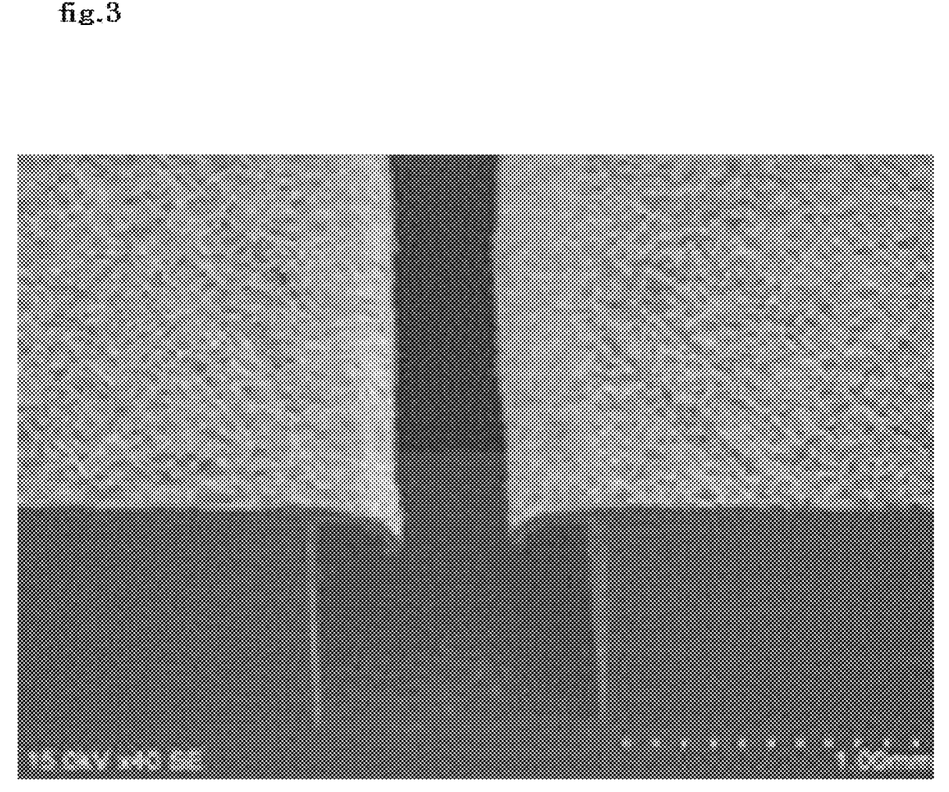
FIG. 3 is an SEM photograph of a cross section of a polishing layer taken after an 8-hour accelerated dressing test using a polishing pad produced in Comparative example 3.

The same evaluation as in Example 1 was performed except for using the thermoplastic polyurethane F in place of the thermoplastic polyurethane A. The results are shown in Table 1. FIG. 3 shows a scanning electron microscope (SEM) photograph of a cross section of the polishing pad produced in Comparative example 3, taken after the accelerated dressing test. FIG. 4 shows a chart of the temperature dependence of the dynamic viscoelastic modulus.

Comparative Example 4

PTMG 2000, poly(2-methyl-1,8-octamethylene-co-nonamethylene adipate)diol (PNOA 2000; molar ratio of nonamethylene unit and 2-methyl-1,8-octamethylene unit=7:3) having a number average molecular weight 2000, 1,4-cyclohexanedimethanol (CHDM), BD, and MDI were mixed at a ratio of PTMG 2000:PNOA 2000:BD:CHDM:MDI=21.7:9.3:13.6:5.4:50.0 (mass ratio), to prepare a prepolymer. Then, the obtained prepolymer was kneaded in a small-sized kneader for 5 minutes at 240° C. and a screw speed of 100 rpm, to obtain a thermoplastic polyurethane G.

The same evaluation as in Example 1 was performed except for using the thermoplastic polyurethane G in place of the thermoplastic polyurethane A. The results are shown in Table 1.

Comparative Example 5

PTMG 2000, PNOA 2000, CHDM, BD, and MDI were mixed at a ratio of PTMG 2000:PNOA 2000:BD:CHDM:MDI=17.0:7.3:15.2:6.1:54.4 (mass ratio), to prepare a prepolymer. Then, the obtained prepolymer was kneaded in a small-sized kneader for 5 minutes at 240° C. and a screw speed of 100 rpm, to obtain a thermoplastic polyurethane H.

The same evaluation as in Example 1 was performed except for using the thermoplastic polyurethane H in place of the thermoplastic polyurethane A. The results are shown in Table 1.

As can be seen from Table 1, no burr was generated during the accelerated dressing test in the case of using the polishing pads of Examples 1 to 3, each of which used a non-porous molded article of a thermoplastic polyurethane having a maximum value of tan δ in the range of −70 to −50° C. of $4.00 \times 10^{-2}$ or less as the polishing layer. Furthermore, the thermoplastic polyurethane sheets had high laser transmittances. On the other hand, as can be seen from Table 1, in the case of using the polishing pads of Comparative examples 1 to 5, each of which used a non-porous molded article of a thermoplastic polyurethane having a maximum value of tan δ in the range of −70 to −50° C. exceeding $4.00 \times 10^{-2}$ as the polishing layer, burrs were generated during the accelerated dressing test, and the thermoplastic polyurethane sheets had low laser transmittances.

REFERENCE SIGNS LIST

10 . . . Polishing pad
11 . . . Rotary platen
12 . . . Slurry supply nozzle
13 . . . Carrier
14 . . . Pad conditioner
15 . . . Material to be polished
16 . . . Polishing slurry
20 . . . CMP apparatus

The invention claimed is:

1. A non-porous molded article for a polishing layer, the non-porous molded article comprising a thermoplastic polyurethane, wherein the thermoplastic polyurethane has a maximum value of a loss tangent (tan δ) in a range of −70 to −50° C. of $4.00 \times 10^{-2}$ or less.

2. The non-porous molded article for a polishing layer according to claim 1, wherein the thermoplastic polyurethane is a reaction product of a polymer diol having a number average molecular weight of 650 to 1400, an organic diisocyanate, and a chain extender, and a content ratio of nitrogen derived from an isocyanate group of the organic diisocyanate is 5.7 to 6.5 mass %.

3. The non-porous molded article for a polishing layer according to claim 1, wherein the thermoplastic polyurethane, in a form of a sheet having a thickness of 0.5 mm, has a laser transmittance at a laser wavelength of 660 nm of 70% or more.

4. The non-porous molded article for a polishing layer according to claim 1, wherein the thermoplastic polyurethane has a tensile modulus after swollen to saturation with 50° C. warm water of 130 to 800 MPa.

5. The non-porous molded article for a polishing layer according to claim 1, wherein the thermoplastic polyurethane has a tensile modulus retention when swollen to saturation with water of 55% or more, the tensile modulus retention being calculated by the following expression:

$$A/B \times 100,$$

where A represents a tensile modulus when swollen to saturation with 50° C. warm water, and B represents a tensile modulus when not swollen to saturation.

6. The non-porous molded article for a polishing layer according to claim 1, wherein the thermoplastic polyurethane, in a form of a sheet, has a contact angle with water of 80 degrees or less.

7. A polishing pad comprising the non-porous molded article for a polishing layer according to claim 1 as a polishing layer.

8. The polishing pad according to claim 7, further comprising:
a cushioning layer stacked on the polishing layer and having a hardness lower than a hardness of the polishing layer.

9. A chemical mechanical polishing method comprising contacting the polishing pad according to claim 7 with an object to be polished.

10. A non-porous molded article comprising a thermoplastic polyurethane, wherein the thermoplastic polyurethane has a maximum value of a loss tangent (tan δ) in a range of −70 to −50° C. of $4.00 \times 10^{-2}$ or less.

11. A polishing pad comprising the non-porous molded article of claim 10.

12. The non-porous molded article for a polishing layer according to claim 1, wherein the thermoplastic polyurethane is obtained by polymerization of a polymer diol having a number average molecular weight of 650 to 1200, an organic diisocyanate, and a chain extender.

13. The non-porous molded article according to claim 10, wherein the thermoplastic polyurethane is obtained by polymerization of a polymer diol having a number average molecular weight of 650 to 1200, an organic diisocyanate, and a chain extender.

* * * * *